US012720937B2

(12) United States Patent
Templier et al.

(10) Patent No.: US 12,720,937 B2
(45) Date of Patent: Aug. 25, 2026

(54) INTERACTIVE DISPLAY DEVICE AND METHOD FOR MANUFACTURING SUCH A DEVICE

(71) Applicant: Commissariat à l'Énergie Atomique et aux Énergies Alternatives, Paris (FR)

(72) Inventors: François Templier, Grenoble Cedex 9 (FR); Fabrice Casset, Grenoble Cedex 9 (FR); Josep Segura Puchades, Grenoble Cedex 9 (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 390 days.

(21) Appl. No.: 18/577,793

(22) PCT Filed: Jul. 12, 2022

(86) PCT No.: PCT/EP2022/069432
§ 371 (c)(1),
(2) Date: Jan. 9, 2024

(87) PCT Pub. No.: WO2023/285449
PCT Pub. Date: Jan. 19, 2023

(65) Prior Publication Data

US 2024/0322100 A1 Sep. 26, 2024

(30) Foreign Application Priority Data

Jul. 16, 2021 (FR) ....................................... 2107693

(51) Int. Cl.
*H10H 20/857* (2025.01)
*H10H 20/825* (2025.01)
*H10W 90/00* (2026.01)

(52) U.S. Cl.
CPC ........ *H10H 20/857* (2025.01); *H10H 20/825* (2025.01); *H10W 90/00* (2026.01)

(58) Field of Classification Search
CPC .... H10H 20/857; H10H 20/825; H10H 29/20; H10H 29/39; H10W 90/00;
(Continued)

(56) References Cited

U.S. PATENT DOCUMENTS

2006/0138647 A1* 6/2006 Crisp .................... H10W 90/00 257/723
2019/0157492 A1* 5/2019 Lai ........................ H10F 39/198
(Continued)

FOREIGN PATENT DOCUMENTS

EP 3 381 060 B1 10/2019

OTHER PUBLICATIONS

International Search Report and Written Opinion for International Application No. PCT/EP2022/069432, mailed Nov. 9, 2022.
(Continued)

*Primary Examiner* — Douglas W Owens
(74) *Attorney, Agent, or Firm* — Wolf, Greenfield & Sacks, P.C.

(57) ABSTRACT

A device including a transfer substrate including electric connection elements; and a plurality of elementary chips bonded and electrically connected to the transfer substrate, each elementary chip including at least one LED and an electronic circuit for controlling said at least one LED, the device further including, associated with at least one elementary chip, a capture or actuation element external to the elementary chip, bonded and electrically connected to the transfer substrate, each elementary chip including an electronic circuit for reading from or controlling the capture or actuation element associated with the chip.

11 Claims, 7 Drawing Sheets

(58) Field of Classification Search
CPC ........... H10W 72/0198; H10W 72/072; H10W 72/20; H10W 72/07232; H10W 72/07236; H10W 72/241; H10P 72/7414; H10P 72/7424; H10P 72/7428; H10P 72/74
See application file for complete search history.

(56) References Cited

U.S. PATENT DOCUMENTS

| | | | | |
|---|---|---|---|---|
| 2019/0313954 | A1 | 10/2019 | Yoo et al. | |
| 2020/0126475 | A1 | 4/2020 | Ting et al. | |
| 2023/0056511 | A1* | 2/2023 | Templier | H10K 59/13 |

OTHER PUBLICATIONS

International Preliminary Report on Patentability for International Application No. PCT/EP2022/069432, mailed Jan. 25, 2024.

* cited by examiner 123
127
125
129
113
115
107
101
101c
101b
101a
105a
105b
103

101b
101c
125
140

131

153
151

INTERACTIVE DISPLAY DEVICE AND METHOD FOR MANUFACTURING SUCH A DEVICE

This application is a national stage filing under 35 U.S.C. § 371 of International Patent Application Serial No. PCT/EP2022/069432, filed Jul. 12, 2022, which claims priority to French patent application FR2107693 filed on Jul. 16, 2021 and entitled "Interactive display device and method of manufacturing such a device". The contents of these applications are incorporated herein by reference in their entireties.

TECHNICAL FIELD

The present disclosure generally concerns the field of image display devices, and more particularly aims at an interactive image display device combining a light emission function and an optical capture function, and at a method of manufacturing such a device. More generally, it concerns an image display device combining a light emission function and a capture or actuation function.

PRIOR ART

There have already been provided, for example in patent applications WO2017089676, EP3401958, and WO2018185433 previously filed by the applicant, image display devices comprising a plurality of elementary monolithic electronic chips arranged in an array on a single transfer substrate. The elementary chips are rigidly assembled to the transfer substrate and connected to elements of electric connection of the transfer substrate for their control. Each chip comprises one or a plurality of light-emitting diodes (LEDs) and a circuit for controlling said one or a plurality of LEDs and corresponds to a pixel of the device. The control circuit comprises a connection surface opposite to said one or a plurality of LEDs, comprising a plurality of electric connection areas intended to be connected to the transfer substrate for the microchip control. The transfer substrate comprises a connection surface comprising, for each microchip, a plurality of electric connection areas intended to be respectively connected to the electric connection areas of the microchip. The chips are transferred onto the transfer substrate, with their connection surfaces facing the connection surface of the transfer substrate, and bonded to the transfer substrate so as to connect the electric connection areas of each microchip to the corresponding electric connection areas of the transfer substrate.

This type of display device is particularly adapted to forming display screens having a large surface area, for example, screens for a computer, a television, a tablet, etc.

The forming of an interactive image display device combining a light emission function and an optical capture function is here more particularly considered. More generally, the forming of an interactive image display device combining a light emission function and a capture or actuation function is here considered.

SUMMARY OF THE INVENTION

An embodiment provides a device comprising:

a transfer substrate comprising electric connection elements; and a plurality of elementary chips bonded and electrically connected to the transfer substrate, each elementary chip comprising at least one LED and an electronic circuit for controlling said at least one LED, the device further comprising, associated with at least one elementary chip, a capture or actuation element external to the elementary chip, bonded and electrically connected to the transfer substrate, each elementary chip comprising an electronic circuit for reading from or controlling the capture or actuation element associated with the chip.

According to an embodiment, each capture and actuation element is a photodetector.

According to an embodiment, each photodetector comprises a photosensitive organic layer.

According to an embodiment, in each elementary chip, the electronic circuit for controlling the LED and the electronic circuit for reading from or controlling the capture or actuation element comprise MOS transistors formed inside and on top of a single-crystal silicon layer.

According to an embodiment, in each elementary chip, the LED is an inorganic LED.

According to an embodiment, in each elementary chip, the LED is a gallium nitride LED.

According to an embodiment, each elementary chip comprises a plurality of sub-pixels, each comprising a LED and a circuit for controlling the LED.

According to an embodiment, in each elementary chip, the circuits for controlling the LEDs of the different sub-pixels of the chip are connected to a same input terminal of the chip, connected to a corresponding connection area of the transfer substrate, intended to sequentially receive emission set point signals for the different sub-pixels of the chip.

According to an embodiment, in each elementary chip, the circuits for controlling the LEDs of the different sub-pixels of the chip are respectively connected to different input terminals of the chip, respectively connected to different corresponding connection areas of the transfer substrate, intended to receive in parallel emission set point signals for the different sub-pixels of the chip.

According to an embodiment, in each elementary chip, the circuit for controlling the LED is configured to control the LED by means of binary-coded digital set point signals.

According to an embodiment, in each elementary chip, the photodetector readout circuit associated with the chip is connected to an output terminal of the chip, connected to a corresponding connection area of the transfer substrate, intended to deliver a signal representative of a light intensity received by the photodetector.

According to an embodiment, the capture or actuation element is a piezoelectric transducer.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DESCRIPTION OF EMBODIMENTS

Figure 1A:
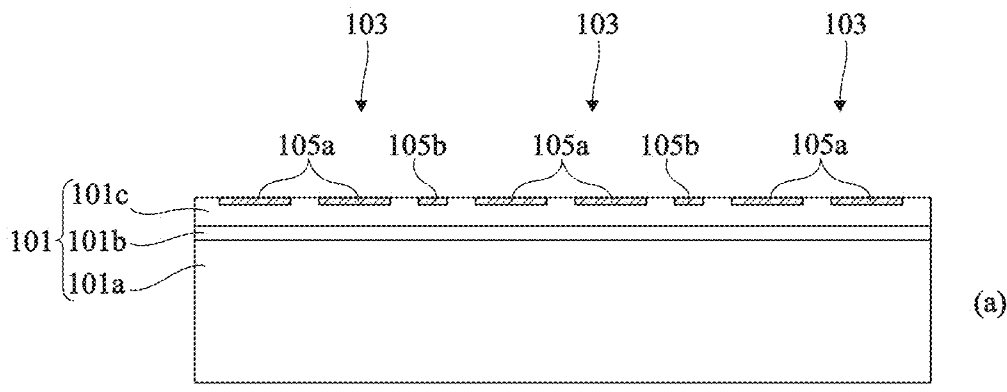
FIGS. 1A, 1B, 1C, 1D, 1E, IF, 1G, 1H, 1I, and 1J are cross-section views illustrating successive steps of an example of a method of manufacturing elementary pixel chips of an interactive display device according to an embodiment.
Figure 1A:
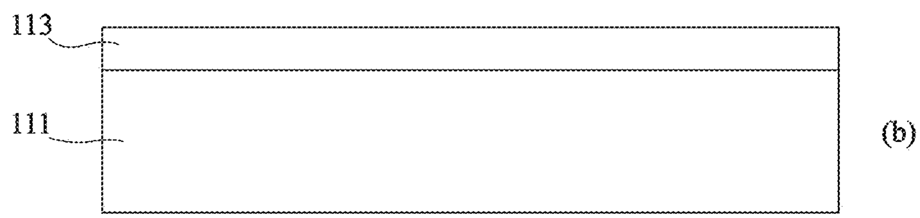

Like features have been designated by like references in the various figures. In particular, the structural and/or functional features that are common among the various embodiments may have the same references and may dispose identical structural, dimensional and material properties.

For the sake of clarity, only the steps and elements that are useful for the understanding of the described embodiments have been illustrated and described in detail. In particular, the various possible applications of the interactive display devices described have not been detailed, the described embodiments being compatible with all or most known applications of an emissive display device integrating an optical capture function, for example applications of motion detection, face recognition, identification, etc., and more generally, of an emissive display device integrating a capture or actuation function.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings.

Unless specified otherwise, the expressions "about", "approximately", "substantially", and "in the order of" signify plus or minus 10%, preferably of plus or minus 5%.

According to an aspect of an embodiment, an image display device comprising a plurality of elementary monolithic electronic chips arranged in an array on a same transfer substrate is provided. As in the examples described in patent applications WO2017089676, EP3401958, and WO2018185433 previously filed by the applicant, the elementary chips are rigidly assembled to the transfer substrate and connected to electric connection elements of the transfer substrate. Each chip comprises one or a plurality of LEDs and a circuit for controlling said one or a plurality of LEDs and corresponds to a pixel of the device. The control circuit comprises a connection surface opposite to said one or a plurality of LEDs, comprising a plurality of electrical connection areas (also called terminals or pads) intended to be connected to the transfer substrate for the control of the microchip. The transfer substrate comprises a connection surface comprising, for each microchip, a plurality of electric connection areas (also called terminals or pads) intended to be respectively connected to the electric connection areas of the microchip. The chips are transferred onto the transfer substrate with their connection surfaces facing the connection surface of the transfer substrate, and bonded to the transfer substrate so as to connect the electric connection areas of each microchip to the corresponding electric connection areas of the transfer substrate.

According to an aspect of an embodiment, the image display device further comprises an optical capture function, for example an image capture function. For this purpose, the device comprises a plurality of photodetectors, for example organic photodetectors, arranged in an array of rows and columns and defining an image sensor. The photodetectors are external to the elementary pixel chips of the display device, and are arranged on the transfer substrate of the device, on the same side of the transfer substrate as the elementary pixel chips. The photodetectors are connected to electric connection terminals on the transfer substrate for their reading.

As an example, the device comprises one photodetector per elementary pixel chip of the device, arranged in the vicinity of said elementary pixel chip. In other words, the array of elementary pixel chips of the display device and the array of photodetectors are interleaved arrays of same dimensions and of same pitch.

According to an aspect of an embodiment, each elementary pixel chip of the display device integrates an electronic circuit for reading an electric signal representative of a light intensity received by the corresponding photodetector, that is, that of same position in the pixel array, of the device. Each elementary pixel chip of the device comprises for this purpose a connection terminal individually connected to an electrode of the associated photodetector via a conductive track of the transfer substrate.

Examples of embodiment of such an interactive display device will be described in further detail hereafter in relation with the drawings.

FIGS. 1A to 1J are cross-section views illustrating an example of a method of manufacturing the elementary pixel chips of the device.

FIG. 1A comprises a view (a) schematically showing a control structure comprising a first substrate 101 inside and on top of which have been formed a plurality of elementary integrated control circuits 103, for example identical or similar, respectively corresponding to the integrated control circuits of the future elementary pixel chips of the device.

In the shown example, substrate 101 is a substrate of SOI (Semiconductor On Insulator) type, comprising a semiconductor support substrate 101*a*, for example made of silicon, an insulating layer 101*b*, for example made of silicon oxide, arranged on top of and in contact with the upper surface of support substrate 101*a*, and an upper semiconductor layer 101*c*, for example made of single-crystal silicon, arranged on top of and in contact with the upper surface of insulating layer 101*b*.

In this example, elementary control circuits 103 are formed inside and on top of the upper semiconductor layer 101*c* of substrate 101. Each elementary control circuit 103 for example comprises a plurality of transistors (not shown in detail in FIGS. 1A to 1I), for example MOS transistors, for example integrated inside and on top of a single-crystal silicon layer. Elementary control circuits 103 are for example formed in CMOS (Complementary Metal Oxide Semiconductor) technology. Each elementary control circuit 103 may comprise a circuit adapted to controlling the emission of light by the LED(s) of the future elementary pixel chip of the device, and a circuit for reading from the photodetector associated with the future elementary pixel chip of the device.

In this example, each elementary control circuit 103 comprises, on its upper surface side, one or a plurality of metal connection pads 105*a*, 105*b*. As an example, pads 105*a*, 105*b* are flush with the upper surface of an upper insulating layer, for example made of silicon oxide, of an interconnection stack (not detailed in the drawings) coating the upper surface of the upper semiconductor layer 103*c* of substrate 101. Thus, in this example, the upper surface of the control structure of view (a) is a planar surface comprising an alternation of metal regions (pads 105*a*, 105*b*) and of insulating regions.

As an example, each elementary control circuit 103 comprises a specific metal pad 105*a* for each LED of the future elementary pixel chip of the device, intended to be connected to an anode region of the LED and enabling to individually control the emission of light by said LED. Each elementary control circuit 103 may further comprise a metal pad 105*b* intended to be connected to a cathode region of each LED of the future elementary pixel chip of the device. In the case where the elementary chip comprises a plurality of LEDs, the cathode contact may be common to all the LEDs of the chip. Thus, elementary control circuit 103 may comprise a single metal pad 105*b*.

As an example, each pixel element chip of the device comprises three individually controllable LEDs adapted to respectively emitting blue light, green light, and red light. In this case, each elementary control circuit 103 may comprise three separate metal pads 105*a* intended to be respectively connected to the anode regions of the three LEDs, and a single metal pad 105*b* intended to be collectively connected to the cathode regions of the three LEDs. In FIG. 1A, only two metal pads 105*a* and one metal pad 105*b* per electronic circuit have been shown.

FIG. 1A further shows a view (b) very schematically showing a structure comprising a second substrate 111, having an active LED stack 113 resting on its upper surface. Active LED stack 113 is for example an inorganic LED stack, for example based on one or a plurality of type III-V semiconductor materials, for example based on gallium nitride. Substrate 111 is for example made of sapphire or of silicon.

Active LED stack 113 for example comprises, in the order from the upper surface of substrate 111, an N-type doped semiconductor layer forming a cathode layer, an active layer, and a P-type doped semiconductor layer forming an anode layer (layers not detailed in the drawing). The active layer for example comprises an alternation of layers of quantum wells made of a first semiconductor material and of barrier layers made of a second semiconductor material defining a stack of multiple quantum wells.

Active stack 113 may be epitaxially formed on the upper surface of substrate 111. As a variant, active stack 113 is epitaxially formed on a growth substrate, not shown, and then transferred onto the upper surface of substrate 111.

At this stage, stack 113 has not been structured into individual LEDs yet. In other words, the layers of stack 113 each extend continuously and with a substantially uniform thickness over the entire upper surface of substrate 111.

Figure 1B:
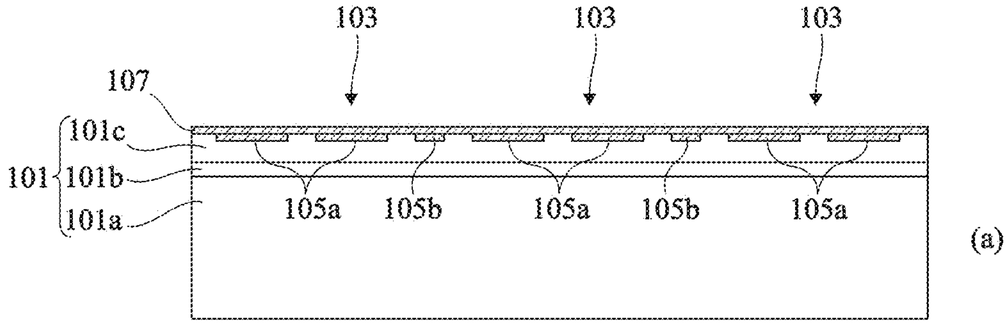
Figure 1B:
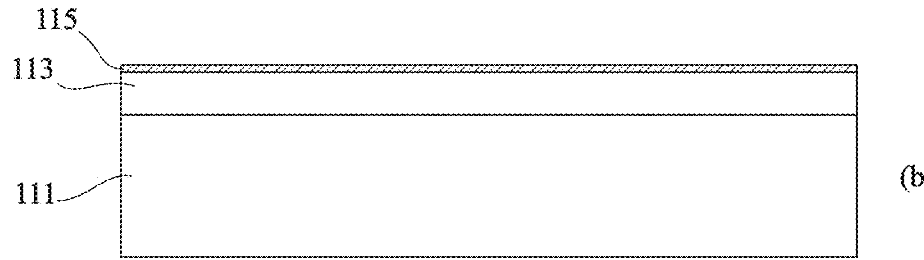

FIG. 1B includes a view (a) illustrating a step of deposition of a metal layer 107 on top of and in contact with the upper surface of the control structure of view (a) of FIG. 1A. In this example, layer 107 continuously extends with a substantially uniform thickness over the entire upper surface of the interconnection stack of the control structure of view (a) of FIG. 1A. Thus, layer 107 connects all the metal pads 105*a*, 105*b* of the control structure to one another.

FIG. 1B further includes a view (b) illustrating a step of deposition of a metal layer 115 on top of and in contact with the upper face of the active LED stack 113 of the structure of view (b) of FIG. 1A. Metal layer 115 may be a single layer or a stack of a plurality of metal layers. Preferably, metal layer 115 comprises, on its upper surface side, a layer made of the same material as layer 107.

Figure 1C:
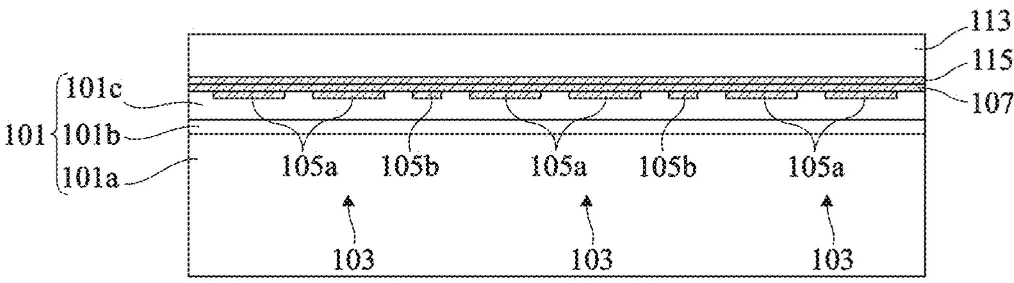

FIG. 1C illustrates the structure obtained as a result of a step of transfer and bonding of active LED stack 113 and of metal layer 115 onto the structure of view (a) of FIG. 1B.

In FIG. 1C, the orientation of the structure of view (a) of FIG. 1B remains unchanged. However, the elements of the structure of view (b) of FIG. 1B are inverted with respect to the orientation of FIG. 1B.

During this step, the structure of view (b) of FIG. 1B is transferred onto the upper surface of the structure of view (a) of FIG. 1B, using substrate 111 as a handle. The lower surface (in the orientation of FIG. 1C, corresponding to the upper surface in the orientation of FIG. 1B) of metal layer 115 is bonded to the upper surface of metal layer 107. The bonding is for example obtained by direct bonding or molecular bonding of the lower surface of layer 115 to the upper surface of layer 107, that is, with no added material between the two layers.

Substrate 111 is then removed, for example by grinding and/or chemical etching, to free the access to the upper surface of active LED stack 113, that is, in this example, the upper surface of the cathode semiconductor layer of active LED stack 113.

Figure 1D:
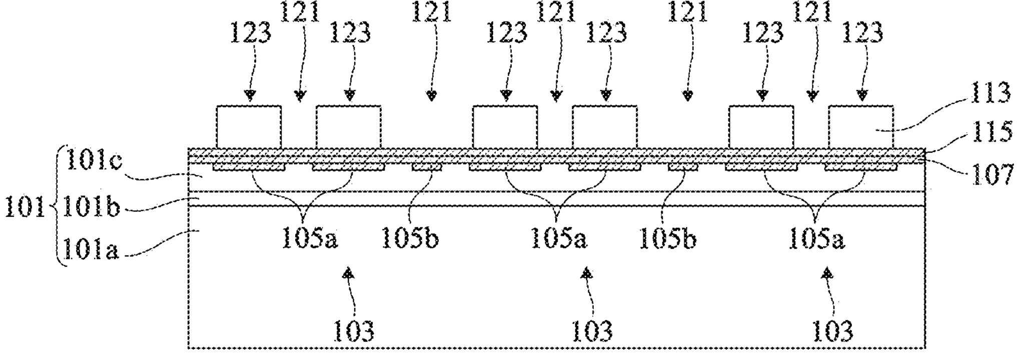

FIG. 1D illustrates a step of forming of trenches 121 vertically extending in the active LED stack from its upper surface and laterally delimiting, in stack 113, a plurality of islands 123 corresponding to the individual LEDs of the future elementary chips of the device. Trenches 121 are for example formed by plasma etching. In the example shown in FIG. 1D, trenches 121 stop on the upper surface of metal layer 115. In top view (not shown), trenches 121 form a grid laterally separating elementary diodes 123 from one another.

Figure 1E:
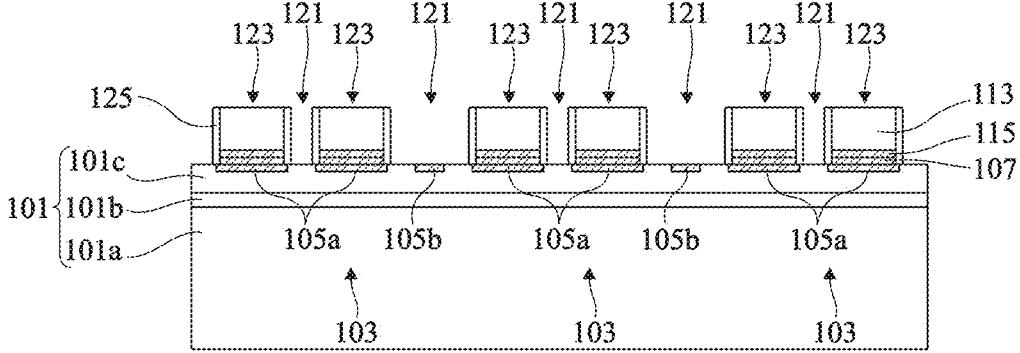

FIG. 1E illustrates a subsequent step of vertical extension of trenches 121 through metal layers 107 and 115, for example using the same etch mask (not shown) as in the previous step. At the end of this step, trenches 121 emerge onto the upper surface of the interconnection stack coating the upper surface of substrate 101.

The portion of the stack of layers 107 and 115 remaining under each LED 123 at the end of this step forms an anode electrode of the LED. Said anode electrode is in contact, by its lower surface, with the upper surface of a metal connection pad 105*a* of the underlying elementary control circuit 103. Thus, each LED has its anode electrode individually connected to a metal connection pad 105*a* of an elementary control circuit 103.

In this example, a trench 121 is also formed in front of each metal connection pad 105*b* to free the access to the upper surface of pads 105*b*.

FIG. 1E further illustrates a subsequent step of passivation of the sides of LEDs 123. To achieve this, a layer 125 made of an electrically-insulating material, for example silicon oxide or silicon nitride, is deposited by a method of conformal deposition on the upper surface of the structure. Layer 125 then coats the upper surface and the sides of LEDs 123, as well as the sides of the portions of metal layers 107 and 115 located under LEDs 123, and, at the bottom of trenches 121, the upper surface of the interconnection stack coating substrate 101. A vertical anisotropic etching step is then carried out to remove the horizontal portions of layer 125, and only keep the vertical portions of this layer, coating the sides of LEDs 123 and the sides of the portions of metal layers 107 and 115 located under LEDs 123.

Figure 1F:
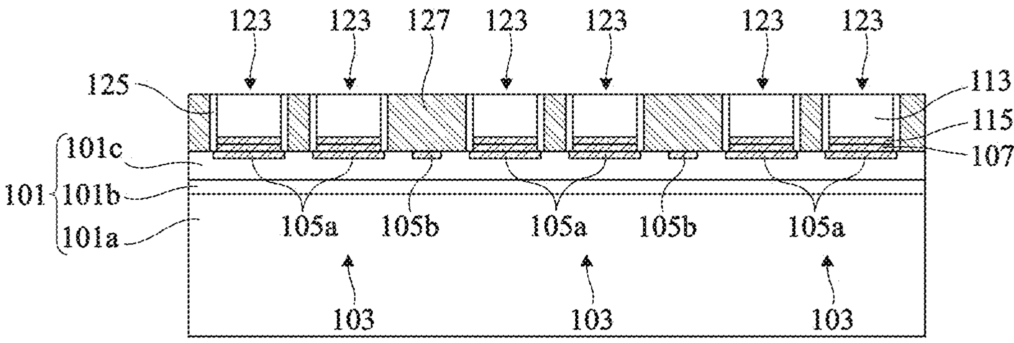

FIG. 1F illustrates a subsequent step of filling of trenches 121 with metal 127. As an example, metal 127 is initially deposited over the entire upper surface of the structure with a thickness greater than the depth of trenches 121, to completely fill trenches 121. A step of planarization, for example by chemical-mechanical polishing, is then carried out to free the access to the upper surface of LEDs 123. A substantially planar upper surface having the semiconductor cathode regions of LEDs 123, the vertical insulation regions 125 of the LEDs, and the metal regions 127 filling trenches 121 flush therewith is thus obtained. In top view (not shown), metal regions 127 form a conductive grid laterally separating LEDs 123 from one another. Metal regions 127 are electrically connected to metal pads 105*b* at the bottom of trenches 121, and define a cathode contact metallization common to all the LEDs 123 of the structure.

Figures 1G, 1H, 1I, 1J:
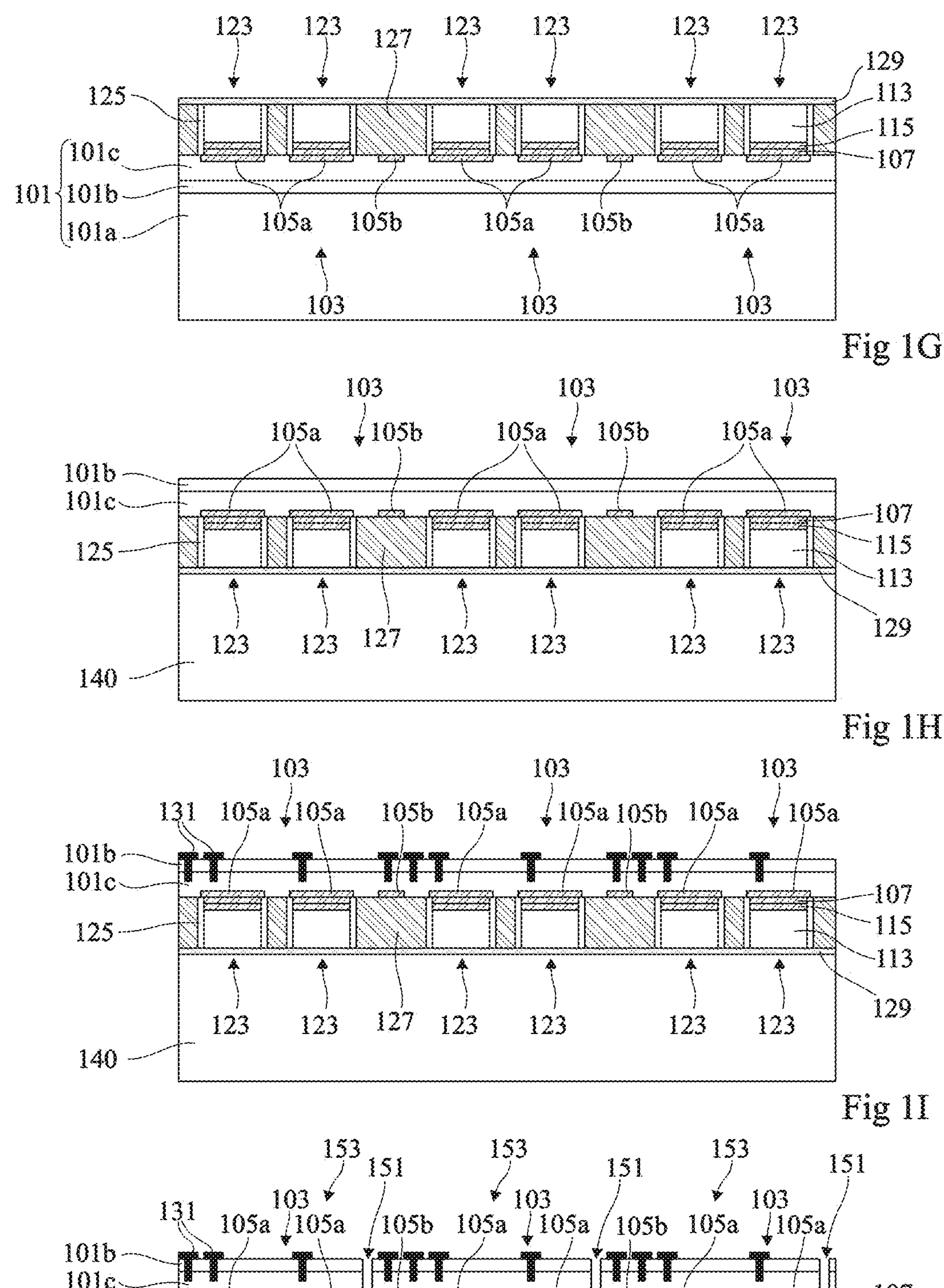

FIG. 1G illustrates a subsequent step of deposition of a conductive layer 129, transparent to the emission wavelengths of the LEDs of the display device, on the upper surface of the structure. Layer 129 for example continuously extends with a substantially uniform thickness over the entire upper surface of the structure of FIG. 1F. Layer 129 is for example made of a transparent conductive oxide, for example of indium tin oxide (ITO). As a variant, layer 129 may be a metal layer sufficiently thin to be transparent, for example a silver layer thinner than 80 nm.

Layer 129 is in contact, by its lower surface, with the upper surface of the cathode semiconductor regions of LEDs 123, and defines a common cathode electrode of LEDs 123. Layer 129 is further in contact, by its lower surface, with the upper surface of metal region 127. Thus, layer 129 electrically connects the cathode semiconductor region of each LED 123 to the common cathode contact metallization 127 of the structure.

FIG. 1H illustrates a subsequent step of transfer of the structure of FIG. 1G onto a temporary support substrate 140. In FIG. 1H, the orientation of the structure is inverted with respect to the orientation of FIG. 1G. The temporary support substrate is bonded to the surface of conductive layer 129 opposite to substrate 101, that is, its lower surface in the orientation of FIG. 1H (corresponding to its upper surface in the orientation of FIG. 1G). Temporary support substrate 140 is for example a silicon substrate. The bonding of temporary support substrate 140 to conductive layer 129 may be obtained by means of an adhesive bonding layer, or by direct bonding.

FIG. 1H further illustrates a subsequent step of removal of the support substrate 101*a* of the initial SOI structure, for example by grinding and/or chemical etching, to free the access to the upper surface of the insulating layer 101*b* of the SOI structure.

It should be noted that the described embodiments are not limited to the example described hereabove, where substrate 101 is an SOI-type substrate. As a variant, substrate 101 may be a solid semiconductor substrate, for example made of silicon. In this case, at the step of FIG. 1A, substrate 101 may be thinned from its back side (upper surface in the orientation of FIG. 1H), for example by grinding. An insulating passivation layer, for example made of silicon oxide, may then be deposited on the upper surface of the thinned substrate, replacing layer 101*b* of the SOI substrate. As a variant, layer 101*b* may be omitted.

FIG. 1I illustrates the structure obtained as a result of the steps of forming of contacting openings in layers 101*b* and 101*c*, and of forming of contacting metallizations 131 inside and on top of said openings. Contact metallizations 131 enable to take electric contacts on metal levels (not detailed in the drawings) of the interconnection stack arranged on the lower surface side of semiconductor layer 101*c*. Metallizations 131 are, for example, electrically connected to transistors of the control circuit, these transistors being themselves electrically connected or coupled to connection metallizations 105*a*, 105*b* of the LEDs.

Metallizations 131 form connection terminals of future elementary pixel chips of the device, intended to be connected to corresponding connection terminals of the transfer substrate of the device.

FIG. 1J illustrates the structure obtained as a result of a step of singulation of the elementary pixel chips of the device. For this purpose, trenches 151 extending vertically through layers 101*b*, 101*c*, 127, and 129 are formed from the upper surface of the structure, along cutting lines. In this example, the trenches emerge onto the upper surface of temporary support substrate 140. In top view, trenches 151 form a continuous grid laterally delimiting a plurality of elementary pixel chips 153, for example identical or similar, each comprising an elementary control circuit 103 and one or a plurality of LEDs 123. Trenches 151 are for example formed by plasma etching.

It should be noted that in the example described in relation with FIGS. 1A to 1J, the elementary LEDs 123 are formed from a same active stack of LEDs and all emit at the same wavelength. In the case where the elementary chips 153 each comprise a plurality of LEDs 123, steps of forming of differentiated light conversion elements on the different LEDs 123 of each chip may be provided, for example after the deposition of cathode conductive layer 129 and before the bonding of temporary support substrate 140. For simplification, the forming of the conversion elements has not been detailed in the drawings. The implementation of these elements is within the abilities of those skilled in the art on reading of the present disclosure. As a variant, each elementary chip may comprise LEDs 123 of distinct natures adapted to respectively emitting in distinct wavelength ranges, in which case the conversion elements may be omitted.

The elementary pixel chips 153 are intended to be transferred onto a transfer substrate 200 of the display device, as will be described in more detail hereafter in relation with FIGS. 3A to 3E.

Figure 2:
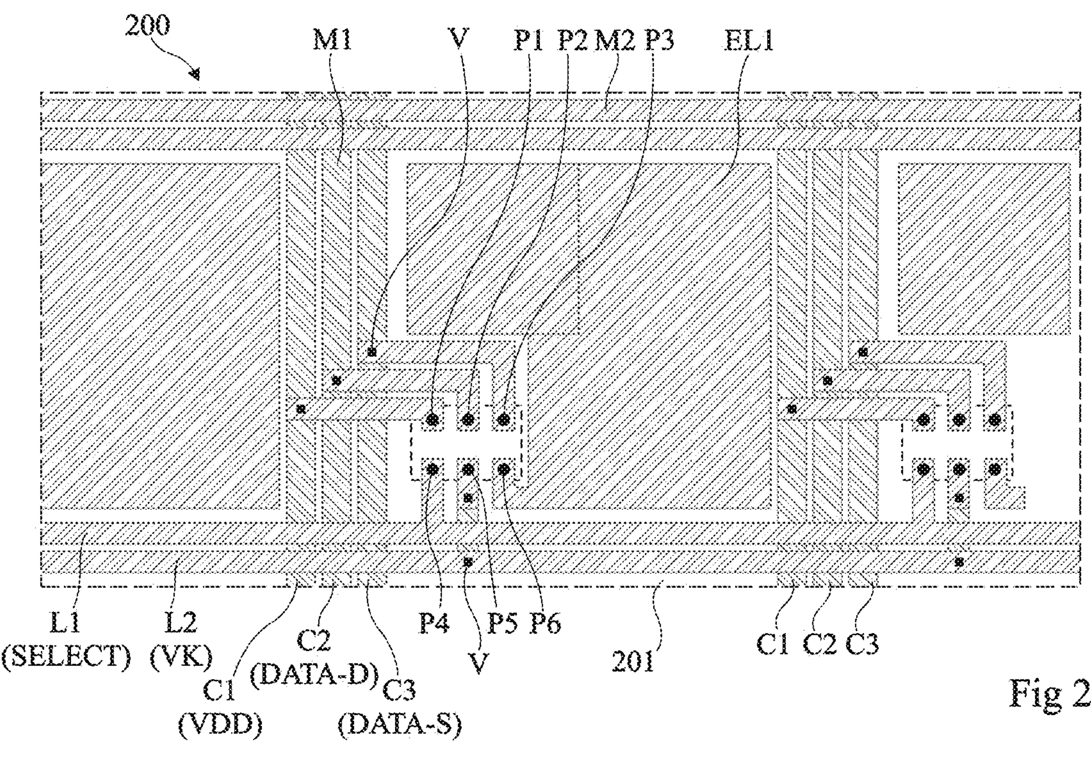
FIG. 2 is a top view schematically and partially illustrating an example of a transfer substrate of an interactive display device according to an embodiment.

FIG. 2 is a partial and simplified top view of an example of embodiment of the transfer substrate 200 of the display device.

In FIG. 2, only a portion of the transfer substrate, corresponding to two adjacent pixels of the same row of the display device, has been shown.

Transfer substrate 200 for example comprises a support plate or sheet 201 made of an insulating material, for example of glass or of plastic. As a variant, support plate or sheet 201 comprises a conductive support, for example, metallic, covered with a layer of an insulating material. The transfer substrate further comprises electric connection elements, and in particular conductive tracks and conductive areas, formed on the upper surface of support plate 201. These electric connection elements are for example formed by printing of a succession of conductive and insulating levels on the upper surface of support plate 201. The electric connection elements are for example formed by a deposition or printing method such as inkjet printing, silk-screening, rotogravure, vacuum deposition, or any other adapted method.

In the shown example, transfer substrate 201 comprises two conductive metal levels M1 and M2 separated by an insulating level (not shown in the drawing), and metal vias V connecting the two metal levels through the insulating level. In this example, transfer substrate 201 further comprises metal connection areas formed on upper metal level M2, intended to be connected to corresponding connection areas 131 of the elementary pixel chips 153 of the device.

Active circuits for controlling the display device, adapted to powering and controlling the elementary chips of the device via the electrical connection elements of the transfer substrate, are for example connected to the electric connection elements of the transfer substrate at the periphery of transfer substrate 200.

In the shown example, the manufacturing of the transfer substrate comprises the following three successive deposition steps.

During a first deposition step, there are formed on the upper surface of support plate 210 a plurality of conductive tracks substantially parallel to the direction of the columns of the display device (vertical direction in the orientation of FIG. 2). More specifically, in this example, during the first deposition step, there are formed for each column of the display device three conductive tracks C1, C2, and C3, extending along substantially the entire length of the columns of the display device. Tracks C1 are intended to distribute a high power supply potential VDD to the different elementary pixel chips 153. Tracks C2 are intended to convey a signal DATA_D for adjusting the light intensity emitted by the LEDs 123 of the elementary chips 153 in the column. Tracks C3 are intended to convey a signal DATA_S representative of the light intensity received by the photodetectors of the pixels in the column.

The conductive elements formed during this first deposition step define the first conductive level M1 of the transfer substrate.

During a second deposition step, the first conductor is covered with an insulating material (not shown in the drawing), to allow the subsequent deposition of conductive tracks extending over tracks C1, C2, and C3, without creating a short circuit with tracks C1, C2, and C3.

During a third deposition step, there are formed on the upper surface of support plate 201 a plurality of conductive tracks substantially parallel to the direction of the rows of the display device. More particularly, in this example, during the third deposition step, there are printed, for each row of the display device, two conductive tracks L1 and L2, extending along substantially the entire length of the rows of the display device. Tracks L1 are intended to convey a signal SELECT of selection of the corresponding pixel row. Tracks L2 are intended to distribute a low power supply potential VK, for example lower than potential VDD, to the elementary pixel chips 153.

In this example, during the third deposition step, there is further printed, for each pixel of the display device, a metal region EL1 defining a lower electrode of the photodetector of the display device.

The conductive elements printed during this third deposition step define the second conductive level M2 of the transfer substrate.

After the third deposition step, there are formed, for each pixel, on conductive areas of metal level M2, six metal areas P1, P2, P3, P4, P5, and P6 intended to respectively receive six separate connection areas 131 of the elementary pixel chip 153. Areas P1, P2, P3, P4, P5, and P6 are respectively connected to conductive tracks C1, C2, C3, L1, L2 and to the electrode EL1 of the pixel, by conductive elements formed in metal level M2 and, optionally, by vias V (open between the second and third deposition steps) and conductive elements formed in metal level M1.

FIGS. 3A to 3E are cross-section views illustrating successive steps of an example of a method of manufacturing an interactive display device according to an embodiment.

Figure 3A:
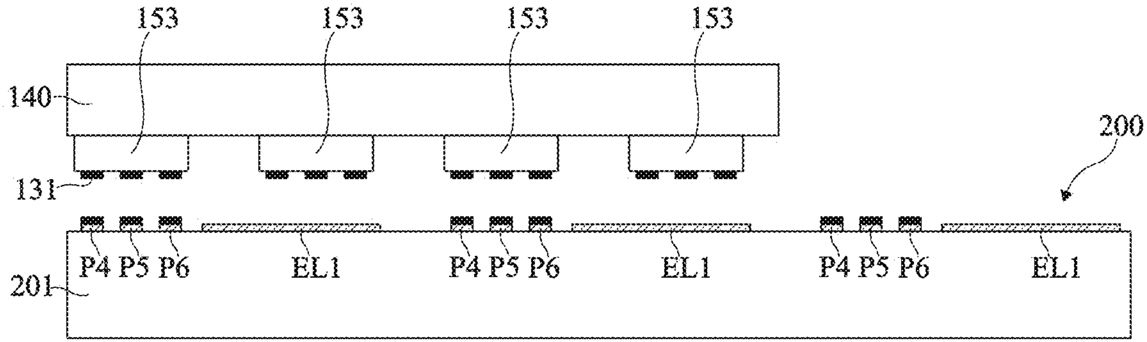
FIGS. 3A, 3B, 3C, 3D, and 3E are cross-section views illustrating successive steps in an example of a method of manufacturing an interactive display device according to an embodiment.
Figure 3B:
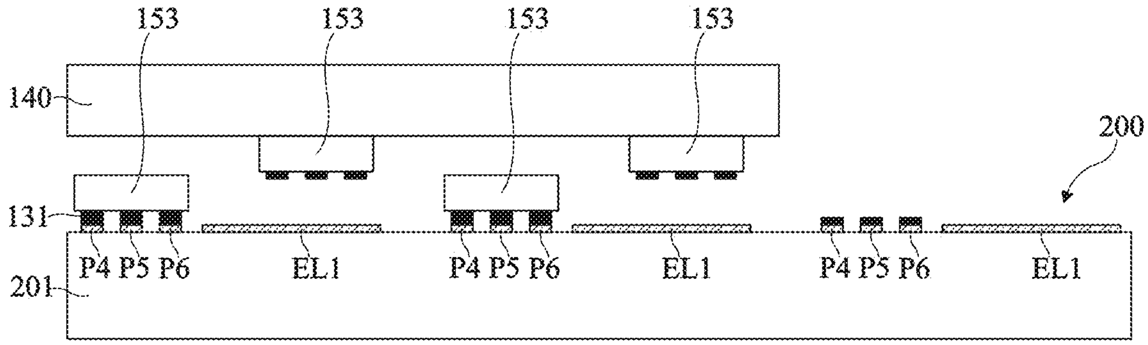

FIGS. 3A and 3B more particularly illustrate a step of collective transfer of elementary pixel chips 153 onto transfer substrate 200.

Elementary chips 153 are initially bonded to a surface of temporary support substrate 140. The structure comprising temporary support substrate 140 and elementary chips 153 is for example formed by a method of the type described in relation with FIGS. 1A to 1J. In the shown example, the structure is flipped with respect to the orientation of FIG. 1J, that is, the elementary chips 153 are arranged on the lower surface side of temporary support substrate 140.

For simplification, in FIGS. 3A to 3J, elementary chip 153 and transfer substrate 200 have been schematically shown, and many elements have been omitted as compared with the representations of FIGS. 1J and 2.

Elementary chips 153 are collectively transferred in front of the connection surface of the transfer substrate 200, that is, its upper surface in the orientation of FIGS. 3A and 3B, using temporary support substrate 140 as a handle (FIG. 3A).

The connection terminals 131 of elementary chips 153, located on the lower surface side of said chips, are then placed into contact with the corresponding connection areas P1, P2, P3, P4, P5, P6 of transfer substrate 200, and bonded to said connection pads P1, P2, P3, P4, P5, P6. The bonding of the connection terminals 131 of elementary chips 153 to the connection areas of the transfer substrate is for example performed by direct bonding, by thermocompression, by soldering, by means of metal microstructures (for example micropillars) previously formed on terminals 131, or by any other adapted bonding and connection method.

Once bonded, by their connection terminals 131, to transfer substrate 200, the elementary chips 153 are separated from temporary support substrate 140 and the latter is removed (FIG. 3B), freeing the access to the emission surface of LEDs 123 (not detailed in FIGS. 3A to 3E).

The pitch of the elementary chips 153 on transfer substrate 200 may be larger than the pitch of the elementary microchips 153 on temporary support substrate 140. Preferably, the pitch of the elementary chips 153 on transfer substrate 200 is a multiple of the pitch of the elementary microchips 153 on temporary support substrate 140. In this case, only part of chips 153 are sampled from support substrate 140 at each transfer, as illustrated in FIGS. 3A and 3B. The other chips 153 remain attached to temporary support substrate 140 and may be used during another collective transfer step to populate another portion of transfer substrate 200 or another transfer substrate.

Figure 3C:
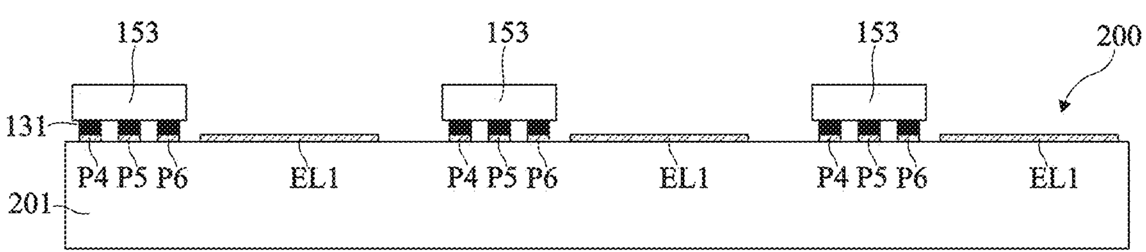

FIG. 3C illustrates the device after the bonding of all the elementary chips 153 to transfer substrate 200.

Figure 3D:
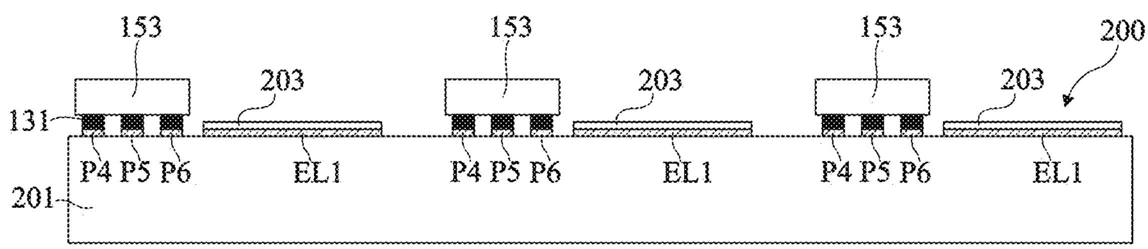

FIG. 3D illustrates a subsequent step of deposition, in each pixel, of a portion of a photosensitive organic layer 203, for example sensitive in the infrared or near-infrared range, on top of and in contact with the upper surface of the pixel electrode EL1. The portions of layer 203 are for example deposited by a local printing method, for example by silk screening or by a slot-die coating method. In each pixel, the organic layer portion 203 extends, for example, over the entire upper surface of pixel electrode EL1.

Figure 3E:
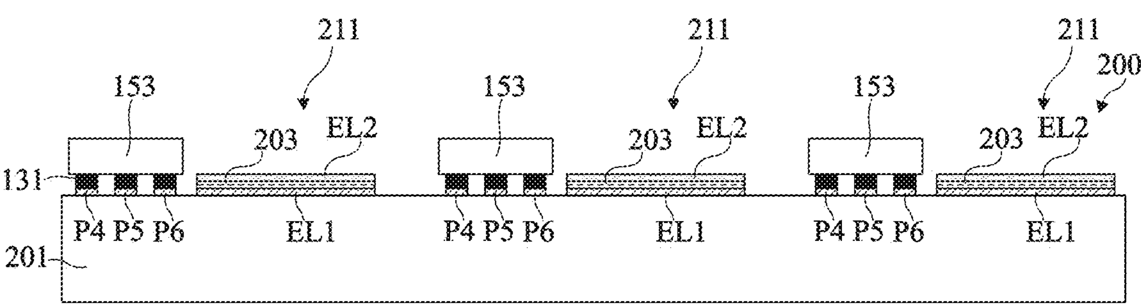

FIG. 3E illustrates a step of deposition, in each pixel, of an upper electrode EL2 on top of and in contact with the upper surface of the portion of photosensitive organic layer 203 of the pixel. Electrode EL2 for example extends over the entire upper surface of the portion of photosensitive organic layer 203 of the pixel. Electrode EL2 is transparent to the wavelengths of sensitivity of layer 203. As an example, electrode EL2 is made of a transparent conductive oxide, such as ITO. In this example, in each pixel, the stack of layers EL1, 203, and EL2 forms a photodetector 211. Electrodes EL1 and EL2 for example respectively correspond to the cathode and anode electrodes of the device.

Electrodes EL2 may be locally deposited through a stencil. As an example, upper electrode EL2 is common to all the pixels of the device. Electrode EL2 forms, for example, in top view, a continuous grid covering the photosensitive layer portions 203 of all the pixels of the device. The common electrode EL2 may then be connected to a node of application of a fixed bias potential VA at the periphery of the pixel array.

After the deposition of electrode EL2, a protective transparent insulating layer, not shown, may optionally be deposited over the entire upper surface of the structure by a conformal deposition method, in particular to encapsulate organic layer 203 and the LEDs of the elementary chips 153 of the pixel. The protective layer is made, for example, of alumina ($Al_2O_3$) or of silicon oxide.

Figure 4:
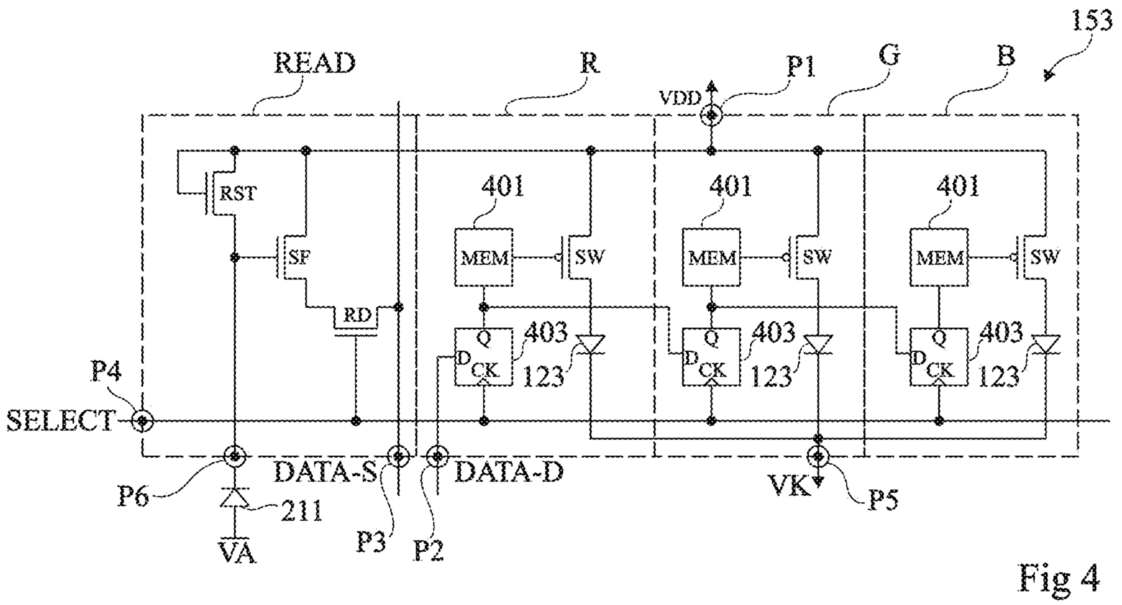
FIG. 4 is an electric diagram of a circuit of an example of an elementary pixel chip of an interactive display device according to an embodiment.

FIG. 4 is an electric diagram of the circuits of an example of an elementary pixel chip 153 of an interactive display device of the type described hereabove.

In this example, chip 153 is a chip with 6 terminals or connection pads 131 respectively connected to the six connection areas P1, P2, P3, P4, P5, and P6 of the support substrate 200 of FIG. 2.

The chip 153 of FIG. 4 comprises three R, G, and B display sub-pixels adapted to emitting in three different wavelength ranges, for example adapted to respectively emitting red light, green light, and blue light. Chip 153 further comprises a circuit READ for reading a signal representative of a light intensity received by the photodetector 211 of the pixel.

Each of the R, G, and B sub-pixels comprises a MOS transistor SW having a first conduction node coupled, for example connected, to terminal P1 of application of high power supply potential VDD, and a second conduction node coupled, for example connected, to the anode of the LED 123 of the sub-pixel. In this example, transistors SW are P-channel MOS transistors, each transistor SW having its source coupled, for example connected, to terminal P1 and its drain coupled, for example connected, to the anode of the LED 123 of the sub-pixel.

In each of the R, G, and B sub-pixels, the LED 123 of the sub-pixel has its cathode coupled, for example connected, to the terminal P5 of application of low power supply potential VK.

In this example, the LEDs 123 are controlled by means of binary-coded digital set point signals, for example using a PWM (Pulse Width Modulation) control method, for example of the type described in patent application EP3079142 previously filed by the applicant. Each of the R, G, and B sub-pixels comprises a memory circuit 401 (MEM), for example a SRAM (Static Random Access Memory) or a D-type flip-flop, adapted to storing a sequence of binary values (0 or 1) respectively defining an off or on state of transistor SW, and thus an off or on state of the LED 123 of the sub-pixel. As a variant, memory circuit 401 may comprise a simple switch and a low-leakage capacitive element. Each memory circuit comprises an output node connected, for example, to a control node (gate) of transistor SW. In this example, each of the R, G, and B sub-pixels further comprises a D flip-flop 403 having a data input node D, a data output node Q coupled, for example connected, to an input node of the memory circuit 401 of the sub-pixel, and a control node CK coupled, for example connected, to the terminal P4 of application of control signal SELECT. In this example, the flip-flops 403 of the different sub-pixels of the chip are series-connected. More particularly, in the shown example, the flip-flop 403 of the R sub-pixel has its data input node D coupled, for example connected, to the terminal P2 of application of emission data signal DATA_D, the flip-flop 403 of the G sub-pixel has its data input node D coupled, for example connected, to the output node Q of the flip-flop 403 of the R sub-pixel, and the flip-flop 403 of the B sub-pixel has its data input node D coupled, for example, to the output node Q of the flip-flop 403 of the G sub-pixel.

In this example, circuit READ for reading from photodetector 211 comprises three N-channel MOS transistors RST, SF, and RD. Transistor RST has its drain coupled, for example connected, to the terminal P1 of application of high supply potential VDD and its source coupled, for example connected, to the cathode terminal P6 of photodetector 211 (electrode EL1 in the example of FIGS. 2 and 3A to 3E). In this example, the gate of transistor RST is connected to the drain of this same transistor. Transistor SF has its drain coupled, for example connected, to terminal P1 and its source coupled, for example connected, to the drain of transistor RD. Transistor SF has its gate coupled, for example connected, to the source of transistor RST. Transistor RD has its source coupled, for example connected, to terminal P3 for supplying the output signal DATA_S of the photodetector. The gate of transistor RD is coupled, for example connected, to the terminal P4 of application of control signal SELECT.

Figure 5:
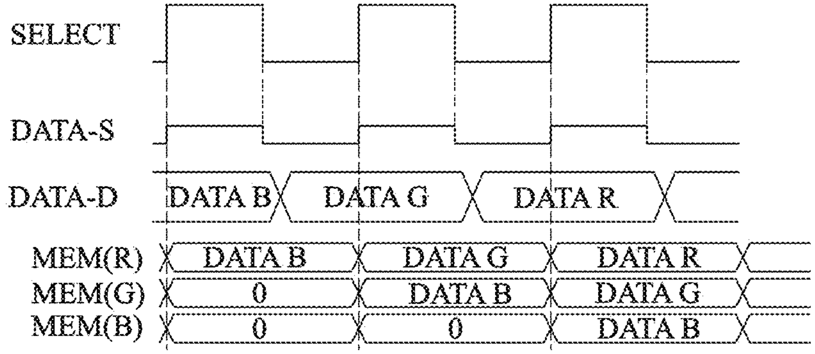
FIG. 5 is a diagram schematically illustrating the operation of the elementary pixel chip of FIG. 4.

FIG. 5 is a diagram schematically illustrating the operation of the elementary pixel chip 153 of FIG. 4. In particular, FIG. 5 shows the time variation of the signals SELECT, DATA_S, DATA_D, MEM(R), MEM(G), and MEM(B) respectively contained in the memories MEM of the R, G, and B sub-pixels.

In this example, the respective emission set point signals DATA R, DATA G, and DATA B of the LEDs 123 of the R, G, and B sub-pixels are digital signals time-division multiplexed on terminal P2 (signal DATA_D). At each rising edge of signal SELECT, an emission data bit of signal DATA_D is transmitted from terminal P2 to the memory 401 of the R sub-pixel, the preceding emission data bit is transmitted from the output terminal Q of the D flip-flop 403 of the R sub-pixel to the memory 401 of the G sub-pixel, and the previous emission data bit is transmitted from the output terminal Q of the D flip-flop 403 of the G sub-pixel to the memory 401 of the B sub-pixel. Thus, three periods of signal SELECT are necessary to transmit three set point signals respectively to the three R, G, and B sub-pixels of the display device.

The diode configuration of transistor RST operating in the weak inversion state implies a logarithmic response of the voltage on its source according to the current which flows through its channel, in this case the photocurrent generated by photodiode 211. Thus, readout circuit READ implements a logarithmic reading of the photocurrent generated by photodetector 211. At each period of activation of signal SELECT, the transistor RD of readout circuit READ is turned on. The signal DATA_S delivered on output terminal P3 then is an analog voltage representative of the instantaneous luminosity received by the pixel photodetector 211. Signal DATA_S can be read and digitized at the foot of the column. As an example, at each update of the emission set point signals of the R, G, and B sub-pixels of the chip, the signal DATA_S of the pixel may be successively read three times and an average of the three values may be calculated to minimize the read noise.

Figure 6:
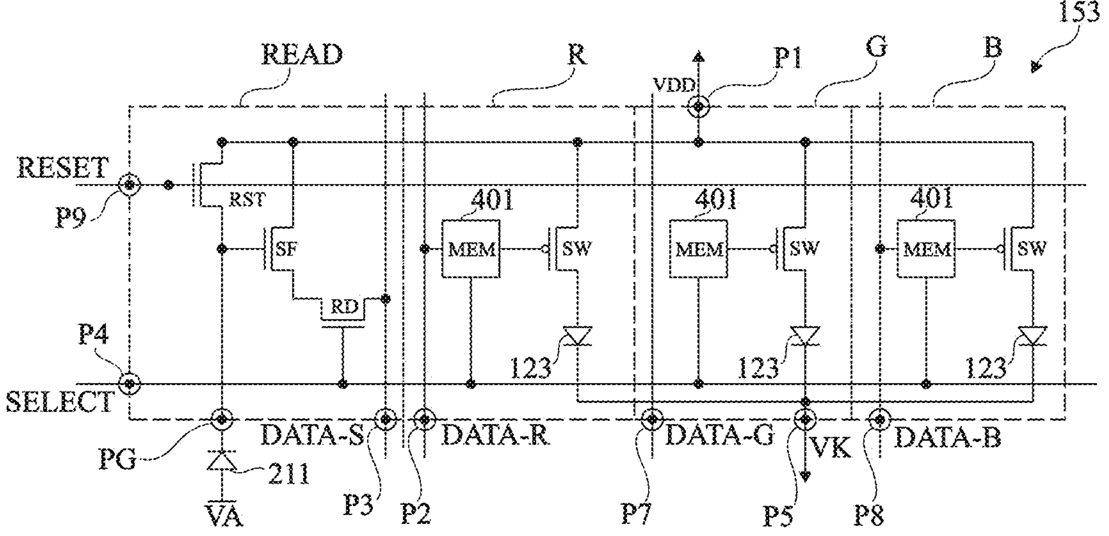
FIG. 6 is an electric diagram of the circuits of another example of an elementary pixel chip of an interactive display device according to an embodiment.

FIG. 6 is an electric diagram of the circuits of another example of an elementary pixel chip 153 of an interactive display device of the above-described type.

In this example, elementary chip 153 comprises nine separate connection pads 131 intended to be respectively connected to nine separate metal connection areas P1, P2, P3, P4, P5, P6, P7, P8, and P9.

The interconnections of terminals P1, P2, P3, P4, and P5 of the various pixels in rows and columns are identical or similar to what has been previously described. As in the previous example, terminal P6 is connected to the lower electrode (cathode) of the pixel photodetector 211. In this example, the terminals P7 of the pixels of a same column are interconnected via the same column conductive track, for example formed in level M1 of the transfer substrate. Similarly, the terminals P8 of the pixels of a same column are interconnected via a same column conductive track, for example formed in level M1 of the transfer substrate. Further, in this example, the terminals P9 of the pixels of a same row are interconnected via the same row conductive track, for example formed in level M2 of the transfer substrate. Those skilled in the art will be capable of accordingly adapting the forming of the transfer substrate 200 of the device.

As in the example of FIG. 4, the chip 153 of FIG. 6 comprises three R, G, and B display sub-pixels adapted to emitting in three different wavelength ranges, for example adapted to respectively emitting red light, green light, and blue light. Chip 153 also includes a circuit READ for reading a signal representative of a light intensity received by the photodetector 211 of the pixel.

The chip 153 of FIG. 6 differs from the chip 153 of FIG. 4 in that, in the example of FIG. 6, the emission set point signals DATA R, DATA G, and DATA B of the different R, G, and B sub-pixels are not time-division multiplexed on a single data input terminal of the chip, but are applied in parallel respectively on terminals P2, P7, and P8.

Thus, in the example of FIG. 6, the flip-flops 403 of the sub-pixels of the chip 153 of FIG. 4 are omitted. In each of the R, G, and B sub-pixels, memory circuit 401 has a data input node coupled, for example connected, to the data input terminal P2, respectively P7, respectively P8 of the sub-pixel, and a control node coupled, for example connected, to the terminal P4 of application of control signal SELECT.

The chip 153 of FIG. 6 also differs from the chip 153 of FIG. 4 in that, in the example of FIG. 6, the gate of the reset transistor RST of read circuit READ is not coupled to the drain of transistor RST, but is connected to terminal P9, which has a reset control signal RESET applied thereto.

Figure 7:
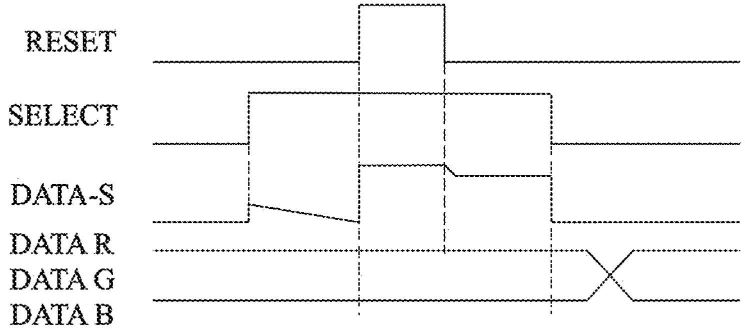
FIG. 7 is a diagram schematically illustrating the operation of the elementary pixel chip of FIG. 6.

FIG. 7 is a diagram schematically illustrating the operation of the elementary pixel chip 153 of FIG. 6. FIG. 7 more particularly shows the time variation of signals RESET, SELECT, DATA_S, DATA R, DATA G, and DATA B.

In this example, signal RESET enables to control the reset transistor RST of the readout circuit READ of photodetector 211. This enables, at each reading, to sample a first value of signal DATA_S at the end of an integration period during which reset transistor RST is kept off, and then a second value of signal DATA_S immediately after a reset period of photodetector 211 during which reset transistor RST is kept on (the end of the reset period marking the beginning of a second integration period). The difference between the two read values defines the output value of the pixel. A double-sampling reading is thus carried out.

The described embodiments are not limited to the examples of electronic control circuits described in relation with FIGS. 4 to 7. As a variant, in the example of FIG. 6, terminal P9 may be omitted and the gate of reset transistor RST connected to the drain of this same transistor RST. A chip with 8 terminals having, for its photodetector portion, an operation similar to that of the chip of FIG. 4, is then obtained.

In another variant, in the example of FIG. 4, the gate of reset transistor RST may be connected not to the drain of this same transistor, but to an external terminal, not shown, intended to receive a reset control signal. A chip with 7 terminals having, for its photodetector portion, an operation similar to that of the chip of FIG. 6, is then obtained.

In another variant, in the example of FIG. 4, an additional D flip-flop may be added to the readout circuit READ of photodetector 211. This enables to control reset transistor RST according to the same offset principle as the LEDs 123 of the R, G, and B sub-pixels. A fourth control bit is then introduced into signal DATA_D to drive transistor RST. As an example, transistor RST is controlled to the on state after the three successive readings of signal DATA_S (FIG. 5). In this case, read circuit READ is preferably located on the right-hand side of the circuit, that is, the additional flip-flop of circuit READ has an input node connected to the output node Q of the flip-flop 403 of the B sub-pixel, an output node connected to the gate of transistor RST, and a control node connected to the terminal P4 of application of signal SELECT.

Various embodiments and variants have been described. Those skilled in the art will understand that certain features of these various embodiments and variants may be combined, and other variants will occur to those skilled in the art. In particular, the described embodiments are not limited to the specific examples of embodiment of the elementary pixel chip and of the transfer substrate described in relation with FIGS. 1A to 1J, 2, and 3A to 3E.

Further, the described embodiments are not limited to the specific examples of embodiments of the electronic circuits for controlling the elementary pixel chips described in relation with FIGS. 4 to 7.

Further, the described embodiments are not limited to the specific case described hereabove where the photodetectors of the device are organic photodiodes. As a variant, the organic photodetectors of the described device may be replaced with inorganic photodetectors, for example based on type III-V semiconductor materials, for example based on indium-gallium arsenide, or based on amorphous silicon. In another variant, photodetectors 211 may be formed of a matrix layer, for example made of resin, having quantum dots incorporated therein.

More generally, the photodetectors may be replaced, totally or partly, with any other capture or actuation element. These capture or actuation elements may be of any type. A non-limiting example of such elements may be, for example, ultrasonic or acoustic transducers, for example of piezoelectric type. This for example enables to implement functions of touch detection or of detection of the proximity of an object, for example a user's hand, for example using the direct piezoelectric effect, and/or haptic stimulation functions, and/or directional acoustic wave emission functions, for example using the indirect piezoelectric effect.

Thus, by actuation function there is meant, for example, the actuation of piezoelectric actuators in order to generate an ultrasonic wave or a vibration mode capable of causing a haptic effect perceptible by the user.

As an example, all or part of the photodetectors may be replaced with piezoelectric actuators, each comprising a stack:

of a lower electrode, for example metallic, for example made of silver, of molybdenum, of platinum, of gold, or of an alloy of one or a plurality of these materials, of a layer of a piezoelectric material, for example, lead zirconium titanate (PZT), aluminum nitride (AlN), or any other piezoelectric material, and of an upper electrode, for example metallic, for example made of silver, of molybdenum, of platinum, of ruthenium, of gold, or of an alloy of one or a plurality of these materials.

The application of an electric field between the upper electrode and the lower electrode induces a deformation of the piezoelectric material. According to the signal sent, for example, sinusoidal at a frequency defined as being the sized work frequency, the actuator generates an ultrasonic wave or a vibration mode (for example, of bending mode type, or an antisymmetrical Lamb mode), for example capable of generating a haptic effect. This effect may result from a variation of the friction coefficient, particularly if the generated vibration mode is a Lamb mode.

The electronic circuits for reading from elementary chips 153 are then replaced with electronic circuits for controlling the capture or actuation elements, for example circuits for controlling the ultrasonic transducers in transmission and/or reception.

As an example, in the embodiment of FIG. 6, signal RESET may be replaced with a control signal, for example pulsed or sinusoidal, used to actuate the capture or actuation element, for example piezoelectric, instead of the photodiode when signal SELECT is active.

As an example, in the method described hereabove in relation with FIGS. 3A to 3E, the photosensitive organic layer 201 is replaced by a piezoelectric or ferroelectric layer, for example made of aluminum nitride (AlN), of lead titano-zirconate (PZT), or of zinc oxide (ZnO). The stack comprising the lower electrode EL1, the piezoelectric layer, and the upper electrode EL2 may be directly deposited on substrate 201, or manufactured separately and transferred onto substrate 201. Each of electrodes EL1 and EL2 may be made of metal or of a transparent conductive oxide.

As a variant, the capture or actuation elements may be arranged on substrate 201 before the step of transfer of elementary chips 153.

Finally, the practical implementation of the described embodiments and variants is within the abilities of those skilled in the art based on the functional indications given hereabove.

The invention claimed is:

1. Device comprising:

a transfer substrate comprising electric connection elements; and a plurality of discrete monolithic elementary chips bonded and electrically connected to the transfer substrate, each elementary chip comprising at least one LED and an electronic control circuit, the electronic control circuit comprising a plurality of transistors, the electronic control circuit comprising a circuit for controlling said at least one LED, the device further comprising, associated with at least one elementary chip, a capture or actuation element external to the elementary chip, bonded and electrically connected to the transfer substrate, wherein, in each elementary chip, the electronic control circuit further comprises an electronic circuit for reading from or controlling the capture or actuation element associated with the chip.

2. Device according to claim 1, wherein each capture and actuation element is a photodetector.

3. Device according to claim 2, wherein each photodetector comprises a photosensitive organic layer.

4. Device according to claim 1, wherein, in each elementary chip, said at least one LED is an inorganic LED.

5. Device according to claim 4, wherein, in each elementary chip, said at least one LED is a gallium nitride LED.

6. Device according to claim 1, wherein each elementary chip comprises a plurality of sub-pixels, each comprising a LED and a circuit for controlling the LED.

7. Device according to claim 6, wherein, in each elementary chip, the circuits for controlling the LEDs of the different sub-pixels of the chip are connected to a same input terminal of the chip, connected to a corresponding connection area of the transfer substrate, intended to sequentially receive emission set point signals for the different sub-pixels of the chip.

8. Device according to claim 6, wherein, in each elementary chip, the circuits for controlling the LEDs of the different sub-pixels of the chip are respectively connected to different input terminals of the chip, respectively connected to different corresponding connection areas of the transfer substrate, intended to receive in parallel emission set point signals for the different sub-pixels of the chip.

9. Device according to claim 1, wherein, in each elementary chip, the circuit for controlling said at least one LED is configured to control said at least one LED by means of binary-coded digital set point signals.

10. Device according to claim 2, wherein, in each elementary chip, the circuit for reading from the photodetector associated with the chip is connected to an output terminal of the chip, connected to a corresponding connection area of the transfer substrate, intended to deliver a signal representative of a light intensity received by the photodetector.

11. Device according to claim 1, wherein the capture or actuation element is a piezoelectric transducer.

* * * * *